United States Patent
Gaudreau et al.

(10) Patent No.: US 6,900,557 B1
(45) Date of Patent: May 31, 2005

(54) HIGH POWER MODULATOR

(75) Inventors: Marcel P. J. Gaudreau, Lexington, MA (US); Michael A. Kempkes, Westford, MA (US); Timothy J. Hawkey, Lincoln, MA (US); Jeffrey Casey, Winchester, MA (US); James M. Mulvaney, Southborough, MA (US); Peter A. Dandrige, Lynn, MA (US)

(73) Assignee: Diversified Technologies, Inc., Bedford, MA (US)

( * ) Notice: Subject to any disclaimer, the term of this patent is extended or adjusted under 35 U.S.C. 154(b) by 0 days.

(21) Appl. No.: 09/479,982

(22) Filed: Jan. 10, 2000

(51) Int. Cl.$^7$ ............................................... H01H 19/64
(52) U.S. Cl. ....................... 307/113; 332/106; 332/134; 307/151
(58) Field of Search ........................ 307/17, 112, 113, 307/115, 125, 127; 323/268, 272; 361/54; 313/324; 363/54, 68, 65

(56) References Cited

U.S. PATENT DOCUMENTS

| | | | |
|---|---|---|---|
| 3,938,026 A | * 2/1976 | Hoffmann et al. | 363/68 |
| 3,996,543 A | 12/1976 | Conner et al. | 336/58 |
| 4,209,826 A | * 6/1980 | Priegnitz | 323/285 |
| 4,370,607 A | * 1/1983 | Dassonville | 323/271 |
| 4,447,866 A | * 5/1984 | Reeves | 323/266 |
| 4,461,966 A | * 7/1984 | Hebenstreit | 327/432 |
| 4,511,815 A | * 4/1985 | Wood | 327/436 |
| 4,535,400 A | * 8/1985 | Itani | 363/68 |
| H000275 H | * 5/1987 | Milberger et al. | 327/109 |
| 4,777,406 A | * 10/1988 | Ross et al. | 363/68 |
| 4,779,035 A | * 10/1988 | Engelmann | 320/139 |
| 4,864,197 A | * 9/1989 | Fitzgerald | 315/408 |
| 4,916,599 A | * 4/1990 | Traxler et al. | 363/65 |
| RE33,345 E | * 9/1990 | Sylvester, Jr. et al. | 336/180 |
| 4,967,101 A | * 10/1990 | Nakamura et al. | 327/109 |
| 5,027,018 A | * 6/1991 | Kindlmann et al. | 327/434 |
| 5,089,719 A | * 2/1992 | Kamei et al. | 327/109 |
| 5,148,064 A | * 9/1992 | Kevorkian et al. | 327/427 |
| 5,162,965 A | * 11/1992 | Milberger et al. | 361/56 |
| 5,424,937 A | * 6/1995 | Iyotani et al. | 363/136 |
| 5,444,610 A | * 8/1995 | Gaudreau et al. | 363/54 |
| 5,469,041 A | * 11/1995 | Bourgeois | 363/134 |
| 5,646,833 A | * 7/1997 | Gaudreau et al. | 363/54 |
| 5,835,367 A | * 11/1998 | Pan et al. | 336/212 |
| 5,856,739 A | * 1/1999 | Trica | 323/222 |
| 6,020,732 A | * 2/2000 | Wood | 323/356 |
| 6,107,860 A | * 8/2000 | Vinciarelli | 327/427 |
| 6,246,598 B1 | * 6/2001 | Tarter et al. | 323/282 |

OTHER PUBLICATIONS

"IRF840 HEXFET Power MOSFET Data Sheet", 1997.*
International Rectifier, "IRLML2803 HEXFET Power MOSFET Data Sheet", Aug. 1997.*
P. Wood, "Transformer–Isolated HEXFET® Driver Provides very large duty cycle ratios" *HEXFET Designer's Manual* Chapter 9 Application Note 950A:I–75–I–77 (1987).

* cited by examiner

*Primary Examiner*—Robert L. Deberadinis
(74) *Attorney, Agent, or Firm*—Iandiorio & Teska

(57) ABSTRACT

A compact transformer coupled modulator is described. The modulator includes a transformer comprising a primary and a plurality of secondary windings, where each secondary winding has an output terminal. The modulator also includes a plurality of switches, where each switch is associated with a respective secondary winding and has input and output terminals and a control terminal. The control terminal of each switch is in electrical communication with a respective output terminal of the plurality of secondary windings. Each of the plurality of switches is substantially simultaneously switched by an input signal applied to the primary.

26 Claims, 6 Drawing Sheets

HIGH POWER MODULATOR

FIELD OF THE INVENTION

This invention relates to the field of high voltage modulators and, more particularly, to solid state modulators for high voltage systems.

BACKGROUND

Reliable high-speed, high-power switching has a wide variety of applications such as radar and communications transmitters, ion implantation, particle accelerators, induction heating, and materials processing. Applications of high-speed, high-power switching require consistent, controllable, rapid, and cost-effective switching of high levels of electrical power. The components and technologies currently available to support these high-power switching applications were developed in the 1930's and 1940's. Despite the revolution in cost and performance that solid state technology has brought to nearly every other realm of electronics, progress with solid state high voltage and high power switching devices has been slow and improvements have been modest.

For example, vacuum switch tubes or thyratrons, alone or in combination with Pulse Forming Networks (PFNs) and pulse transformers, have been used to switch high voltage power supplies and high voltage loads, such as gyroklystrons. The non-ideal behavior of tube switches, however, results in numerous undesirable characteristics, such as large effective on-voltage drop, limited current capability and speed, limited Pulse Repetition Frequency (PRF) capability, high maintenance, and complex driving and protection circuitry. Nevertheless, such switches have provided a nearly exclusive solution to the problem of high-voltage switching until recently.

Typical tube switches use a single device to switch the entire switching voltage. Consequently, the high voltage capability of most tube switches is limited to the high voltage capability of a single tube. This limits the reliability and flexibility of high voltage systems using these tubes. Thus, as new system requirements extend to higher voltage or power, the use of tubes becomes increasingly problematic.

SUMMARY OF THE INVENTION

The present invention relates to a high power modulator that uses semiconductor devices as a cost-effective alternative to high voltage tubes. Using solid state semiconductor devices results in a simpler modulator design with higher reliability, higher efficiency, and lower cost. Solid state devices are generally low voltage devices. However, recent advances in semiconductor device technology have resulted in devices such as the Insulated Gate Bipolar Transistor (IGBT) which have improved voltage and current handling characteristics. Presently typical commercial IGBT devices can each be used to switch voltage from 600V to 6000V.

IGBTs have the high current handling capability of bipolar transistors (50–1200A), combined with the very low drive current requirements of field effect transistors (FETs). These devices eliminate the need to have cascaded stages of bipolar drives within the device itself, which were required because of the low betas of prior art high-current bipolar circuit designs.

IGBTs can be used for high voltage switching by connecting many devices in series. This technique is described in, for example, U.S. Pat. No. 5,444,610 (hereinafter "the '610 patent"), which is assigned to the assignee of the present application, and which is incorporated herein by reference. The '610 patent describes a high power modulator capable of switching high voltages using large numbers of low voltage switches connected in series, where each of the switches is connected in parallel with a voltage limiting means. This technique provides the flexibility of a modular design with no inherent limit to voltage handling because the voltage limiting means described in this patent has virtually unlimited voltage and current carrying capability.

For some applications, however, the apparatus described in the '610 patent may be physically large and expensive to manufacture. For example, to switch 120 kV, up to 160 series connected IGBTs may be required, which presents size and configuration challenges. In addition, so that no single IGBT sees harmful or destructive voltages, the load must be shared equally among the IGBT devices. Therefore, the gate drives for the IGBT devices must be precisely synchronized.

Thus, an object of the present invention is to incorporate serially connected low voltage switches having load sharing features in a compact, transformer coupled gate switch. By floating each IGBT and its respective gate drive circuitry with respect to ground, by ensuring that all power and control connections to the IGBT and its gate drive are isolated, and voltage limiting means are provided, no single IGBT will experience a voltage greater than its design limit. In addition, the IGBT devices can be highly synchronized and, therefore, can switch substantially simultaneously.

Thus, the present invention features a modulator that comprises one or more transformers and a plurality of switches. The transformers comprise a primary and a plurality of secondary windings. Each secondary winding has an output terminal pair. Each of the plurality of switches is associated with a respective secondary winding and has an output-high terminal and an output-low terminal and a control terminal pair. The control terminal pair of each switch is in electrical communication with a respective output terminal pair of the plurality of secondary windings. When an input signal is applied to the primary of the transformer, a signal is induced in the secondary such that the plurality of switches, which are each coupled to a respective secondary winding, are switched substantially simultaneously.

In one embodiment, the modulator further comprises a stack of switch modules to sharing the same primary as shown in FIGS. 5 and 6. In other embodiments, the modulator further comprises at least one voltage limiter, such as a Zener diode or snubbing circuit, and in one embodiment the at least one voltage limiter is connected in parallel with the output terminal pair of at least one of the plurality of switches. In another embodiment, the plurality of switches are connected in series or in parallel to better match the properties of the load. In further embodiments, at least one of the plurality of switches comprises a transistor, such as an insulated gate bipolar transistor (IGBT), an avalanche-rated field effect transistor (FET), or a power metal oxide FET (MOSFET).

The present invention also features a modulator comprising a transformer, a plurality of retriggerable drive circuits, and a plurality of switches as shown in FIGS. 7 and 8. The transformer includes a primary and a plurality of secondary windings. Each of the plurality of retriggerable drive circuits has an output terminal pair and is electrically connected to a respective one of the plurality of secondary windings. Each of the plurality of switches is associated with a respective retriggerable drive circuit and has an output terminal pair and a control terminal pair. The control terminal pair of each switch is in electrical communication with a respective output terminal pair of the retriggerable drive circuit with which it is associated. In one embodiment of the invention, the modulator comprises a stack of switch modules sharing the primary of the transformer. In operation, when an input signal is applied to the primary of the transformers, each of the plurality of switches is switched substantially simultaneously and remains substantially on until a second signal is applied to the primary of the transformer to turn the switches off.

The present invention also features a method of switching a signal. An input signal is applied to the primary of a transformer. In response to this input signal, a voltage is induced in a plurality of secondary windings of the transformer. This induced voltage switches, substantially simultaneously, each of a plurality of switches that are electrically controlled by a respective one of the plurality of secondary windings. In one embodiment of the invention, each of the plurality of switches is maintained in a substantially conducting state after termination of the input signal. In another embodiment, a gate reset input trigger pulse signal is applied to the single primary winding of the transformer.

The present invention also features a modulator that may be used as a very large, very fast series switch, or circuit breaker that enables high power systems to turned on and off in a rapid, repeatable, and controllable way. When the modulator is used as a switch, power can be substantially removed from the load when the switch is 'off', that is open.

The foregoing and other objects, aspects, features, and advantages of the invention will become more apparent from the following description and from the claims, when viewed in conjunction with the accompanying drawings.

DETAILED DESCRIPTION

Figure 1:
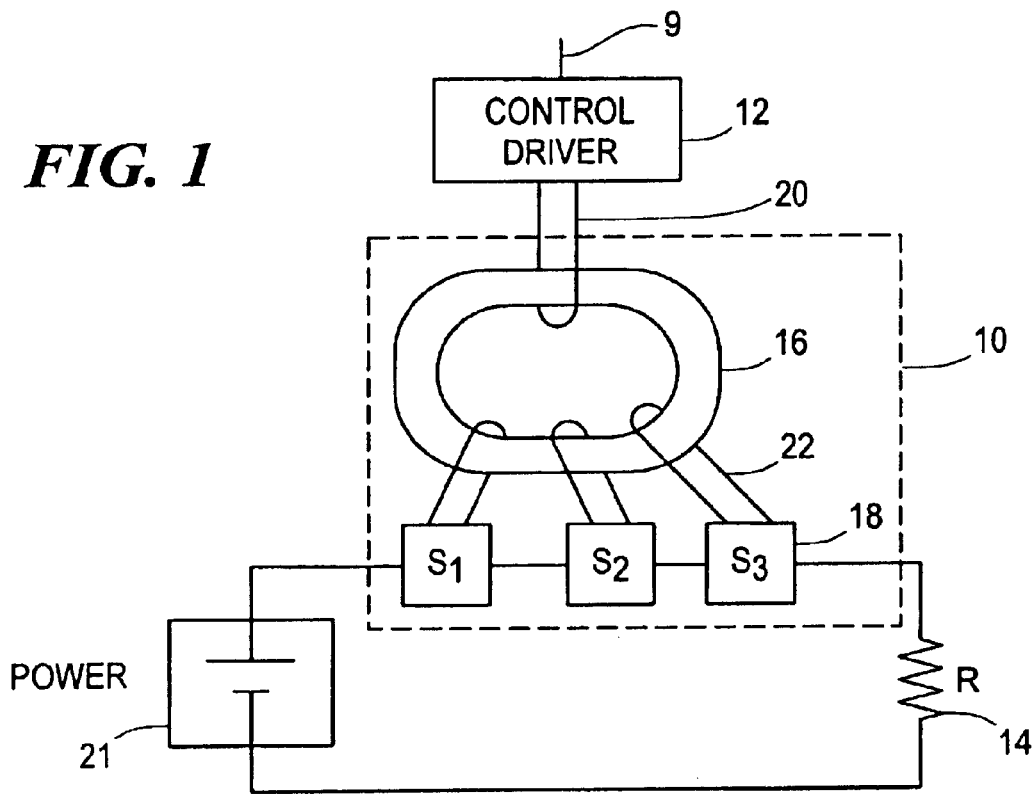
FIG. 1 is a simplified schematic diagram of a modulator with switches connected in series, in accordance with one embodiment of the invention.

Modulators are electronic devices used to precisely regulate the delivery of high voltage, high current electrical pulses. A modulator can act as a simple series switch between a high power supply and its load (such as a klystron). Ideally, modulators have infinite voltage holdoff, infinite off-resistance, zero on-resistance, and fill immunity to transients and voltage reversals. Modulators are critical components of electronic systems used for numerous applications such as radar systems, particle accelerators, medical diagnostics and treatment equipment, and manufacturing equipment, such as ion implantation for semiconductor fabrication. In addition, new processes for food sterilization, waste treatment, and pollution control are also being developed which require the use of high power modulators.

Many high power modulators use pulse transformers to allow switching of the required pulse energy at low voltage. However, conventional pulse modulators generally require large subsystems and vacuum tubes, alone or in combination with pulse-forming networks (PFN's) to drive the pulse transformer. A pulse forming network (PFN) modulator is an electronic device used to precisely regulate the delivery of high voltage, high current electrical pulses.

Achieving a nearly ideal pulse is critical to the performance of a number of pulsed power applications. An "ideal pulse" has instantaneous rise and fall time and a flat top, independent of load current and repetition rate. In ion implantation applications, for example, it is critical to minimize the voltage drop and pulse-to-pulse voltage variation to achieve uniform doping. This requires very fast rise and fall times to minimize the energy provided at voltages other than the amplitude of the pulse. It also requires a very flat-top for the pulse, with no ripple or droop. In radar applications, the rise and fall times must be within the amplifiers' operating parameters. The flat top is very critical to parameters such as phase noise. Generating pulses that most closely approach the ideal pulse waveform is, therefore, often a critical objective of high pulsed power system design.

Historically, vacuum switch tubes or thyratrons, alone, or in combination with PFNs and pulse transformers, have been used to generate pulse waveforms. These conventional switches have non-ideal behavior, such as a large effective voltage drop, limited current capability and speed, high maintenance, and complex driving and protection circuitry. Nevertheless, they have dominated high-voltage switching until recently because no cost effective alternatives have been available. As fixture system requirements extend to higher voltage and power, however, the use of switch tubes becomes increasingly impractical due to the inherent voltage and current limits of these devices.

The physical size of prior art power modulator systems, moreover, generally is very large, which is problematic for many applications. Furthermore, the expected lifetime of conventional power modulator systems using vacuum tubes and pulse forming networks is generally low. To meet these and other needs, the present invention, provides a reliable, fast, compact, low-current, transformer coupled gate switch technology modulator.

The present invention features a solid state modulator that can be used in systems that would otherwise require a switch tube, spark gap, or thyratron pulse forming network (PFN) modulator to switch high voltage and power. FIG. 1 illustrates a modulator 10 according to the present invention that is connected between a power source 21 and a load 14. The modulator 10 includes a transformer 16 connected to the control driver 12, and a plurality of switches 18 connected in series. The transformer 16 further includes a primary winding 20 and a plurality of secondary windings 22. The primary winding 20 may be connected to ground potential while the plurality of secondary windings 22 may float at staggered high voltages. In one embodiment of the invention, the primary winding 20 further includes an input terminal pair and each secondary winding 22 further includes an output terminal.

In addition, although the primary winding 20 is illustrated in FIG. 1 as a single winding, in other embodiments of the invention, the primary winding 20 is a plurality of turns that achieve a predetermined turns ratio (i.e. 2:1 or 4:1). In another embodiment, the primary winding 20 may be a portion of a winding such as a half-turn of a winding. In another embodiment the primary winding 20 is a distributed primary winding. Distributing the winding can improve geometrical packing and reduce leakage inductance.

The transformer 16 can be formed using a toroidal core comprising a high permeability material such as ferrite. Using a toroid provides the advantage that the length and conformation of wire forming each secondary winding 22 will be essentially the same, so that the switches 18 will turn off and on at the same time. In another embodiment (as described in connection with FIG. 6), the modulator 10 includes one or more modules stacked together, with the transformer 16 of each switch modules sharing the same primary winding 20. In one embodiment, the stacked modulator configuration comprises stacks of toroids forming the transformers 16 of the modulators. Closely stacking the toroids is advantageous because it helps to reduce leakage inductance and enables building modules of very high voltage.

Each switch 18 is associated with a respective secondary winding 22. In one embodiment (not shown), each switch is electrically coupled to a respective output terminal pair of the respective secondary winding 22. Each switch 18 includes a transistor, such as an insulated gate bipolar transistor (IGBT), an avalanche FET, or a power MOSFET. For example, a modulator 10 may include an arbitrary number of switches 18, such as IGBTs, connected in parallel and/or in series (which is explained further below). In one embodiment, the switches 18 include a combination of different types of switches, such as a an output voltage limiting means. In another embodiment, each switch 18 includes an input voltage limiting means and an output voltage limiting means, such as disclosed in the '610 patent.

Power MOSFETs, unlike conventional bipolar transistors, are essentially voltage driven devices. Moreover, because power MOSFETs are majority carrier devices and have minimal minority carrier storage time, power MOSFETs have exceptionally fast rise/fall times. Power MOSFETs also are rugged switching devices because they lack the secondary breakdown effect of bipolar transistors.

In comparison, IGBTs have the high input impedance and high speed characteristics of a MOSFET with the conductivity characteristics of a bipolar transistor. In addition, IGBTs can be turned on and turned off electronically, in contrast to thyristor switches conventionally used in some power modulators, which can only be turned on electronically. The fact that IGBT and MOSFET switches turn off electronically with low-power control pulses eliminates the need for PFNs in the modulator.

IGBT switches may be characterized by a low voltage drop in their on-state, for example about 2.5 Volts, so that in saturation the IGBT is essentially a Darlington pair configuration with a FET as the input stage and a bipolar power transistor for the output stage. The risetime of IGBTs is largely determined by the gate drive circuitry, as described below.

In another embodiment, each switch 18 includes avalanche FETs, such as a thousand volt FET with an avalanche rating. A typical avalanche FET could have a saturated on-state resistance of 2Ω and a switching time of about 30 nsec, both of which are sufficient for the modulator applications described herein.

When the switches 18 are connected in series, as illustrated in FIG. 1, each individual series connected switch 18 operates with a floating ground reference. Consequently, all switches will perform identically and none should experience any voltage greater than its design limits regardless of the end of the series stack at which it is located. Each switch 18 and its gate drive circuitry (not shown) can "float" relative to ground, and all enabling and control connections to the switches 18 may be made inductively. Thus, in the embodiment illustrated in FIG. 1, a trigger can be applied at the input 9 and enabling power 21 to be applied to the load via switches 18. In response to the control signal applied to the primary, a voltage is induced at each secondary 22 of the transformer at substantially the same time. Thus, switches 18 will be switched substantially simultaneously.

In one embodiment, the switch 18 is an IGBT, the FET inputs (i.e., the gate signals) are electrically coupled in parallel to the transformer 16 and the outputs of each switch 18 are connected in series with the load 14. The primary winding 20 of the transformer is at ground potential and the secondary windings 22 are floating at staggered high voltages. For a typical IGBT switch, the gate capacitance for each IGBT is approximately 5 nF. During operation, the entire modulator 10 acts as a high voltage switch, so that when an input signal is applied to control driver 12 and power 21 is applied, the switches 18 are switched substantially simultaneously. Because the switches are in series, very high voltages can be switched. For example, if switch 18 is a 1200V IGBT switch and three windings are used as shown in FIG. 1, the circuit of FIG. 1 can switch 3600V by switching 1200V across each switch 18. Additional switches can be added to switch even higher voltages.

Figure 2:
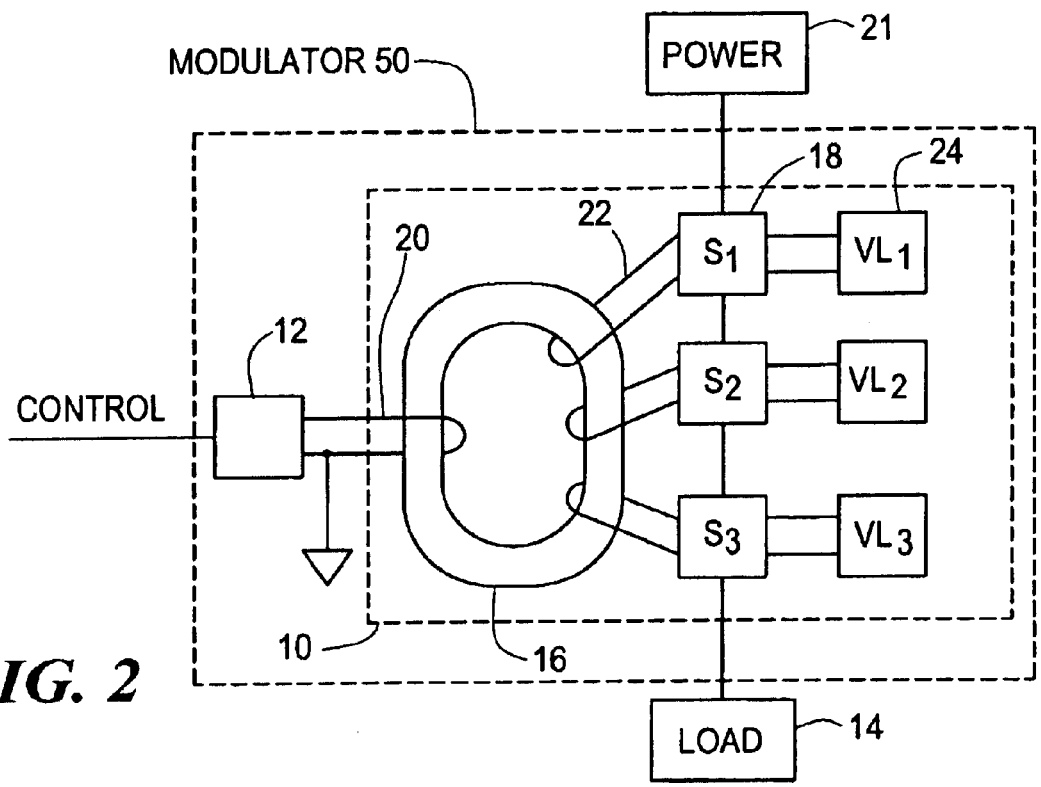
FIG. 2 is a simplified schematic diagram of a modulator with switches connected in series that includes voltage limiting means, in accordance with the invention.

In some embodiments of the invention, the modulator 10 can further include one or more voltage limiting devices to protect the switches 18. FIG. 2 illustrates a modulator 10 that includes a plurality of output voltage limiting devices 24. Each output voltage limiting device 24 is connected in parallel with a respective switch 18.

The voltage limiting device 24 is preferably integrated into the switch 18 itself. Numerous other voltage limiting devices can also be used, such as a Zener diode, a snubbing circuit (such as described in the '610 patent), and a clamping circuit. For example, the voltage limiting means can be a metal-oxide varistor (MOV) or a capacitor connected in parallel with a series combination of a dissipating resistor and a switch (such as described in the '610 patent).

In another embodiment, the switch 18 comprises an avalanche-rated FET that has a voltage limiting capability. Regardless of the type of voltage limiting technique used, if the voltage applied to the switch 18 is above a predetermined value, then the excess current induced by load 14 or source 21 will be conducted through the output voltage limiting device 24. The corresponding voltage drop across the voltage limiting device 24, however, will be substantially independent of the current conducted therethrough.

Figure 3:
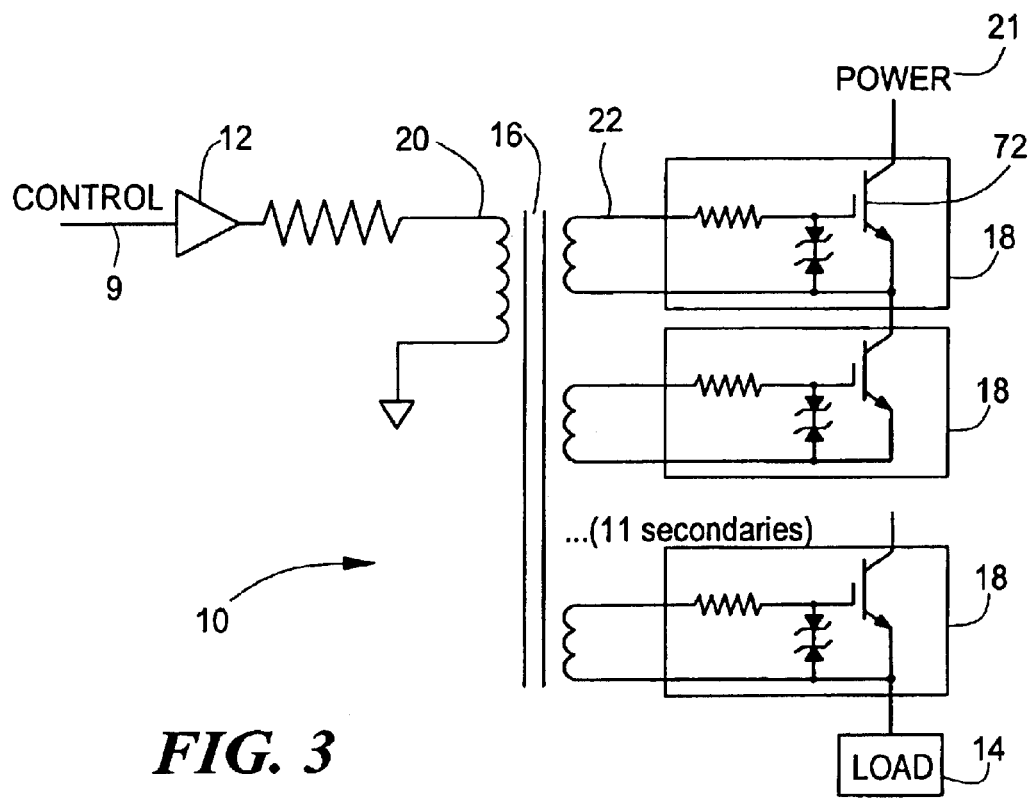
FIG. 3 is a simplified schematic of one embodiment of a modulator with series connected switches, in accordance with the invention.

FIG. 3 illustrates a schematic diagram of one embodiment of the modulator 10, in accordance with the present invention. Eleven IGBT switches 72 are shown to be connected in series and are driven by parallel 1:1 windings. It should be understood, however, that the illustrations of this figure, including the windings on the transformer, are provided by way of example only. Numerous other configurations of windings can be used. For example, better geometrical packing of the windings can reduce transformer leakage. This can be accomplished by using a distributed primary winding, or by using additional windings (i.e. 2:1 or 4:1).

In addition, because leakage inductance affect the current induced in the primary, it may be advantageous to adjust the turns ratio for step-down operation with higher voltage primary drive. For example, a 4:2 step down can be used with a 35 Volt peak-to-peak drive on the transformer primary. In another example, the transformer 16 can be made from a ferrite toroid, and the ferrite toroid can be biased at the midpoint of the switches 18 to reduce the maximum voltage developed between the core of transformer 16 and the switches 18.

In another embodiment (not shown), the transformer 16 can have multiple primary windings in parallel to improve geometrical packing (and reduce leakage inductance). This technique helps to overcome induction limitations of the leakage inductance without adding capacitance to the circuit.

Figure 4:
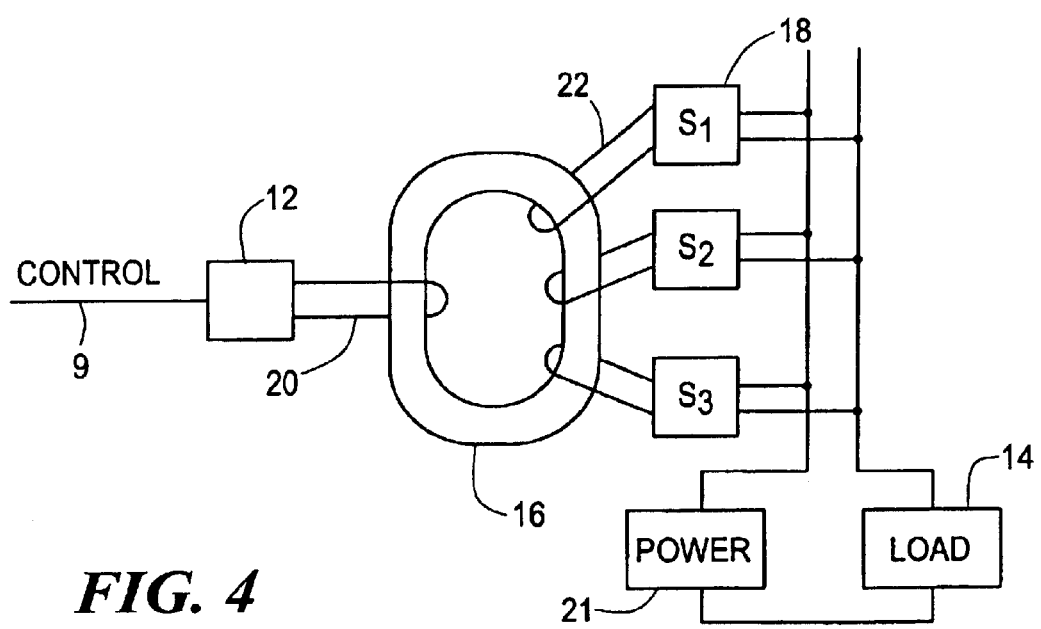
FIG. 4 is a simplified schematic diagram of a modulator having switches connected in parallel, in accordance with an embodiment of the invention.

The series connection of switches illustrated in FIGS. 1, 2, and 3 provide increased voltage handling capability. In contrast, FIG. 4 illustrates another embodiment of the invention wherein the switches 18 are connected in parallel, to provide increased current handling capability. In this embodiment, a control signal, such as a trigger, is applied by control driver 12, and this signal is coupled substantially simultaneously to each switch 18, so that the switches 18 can substantially simultaneously switch current from the electrical power source 21. The ability to substantially simultaneously switch current from the power source increases the current handling capability of the modulator 10.

Figure 5:
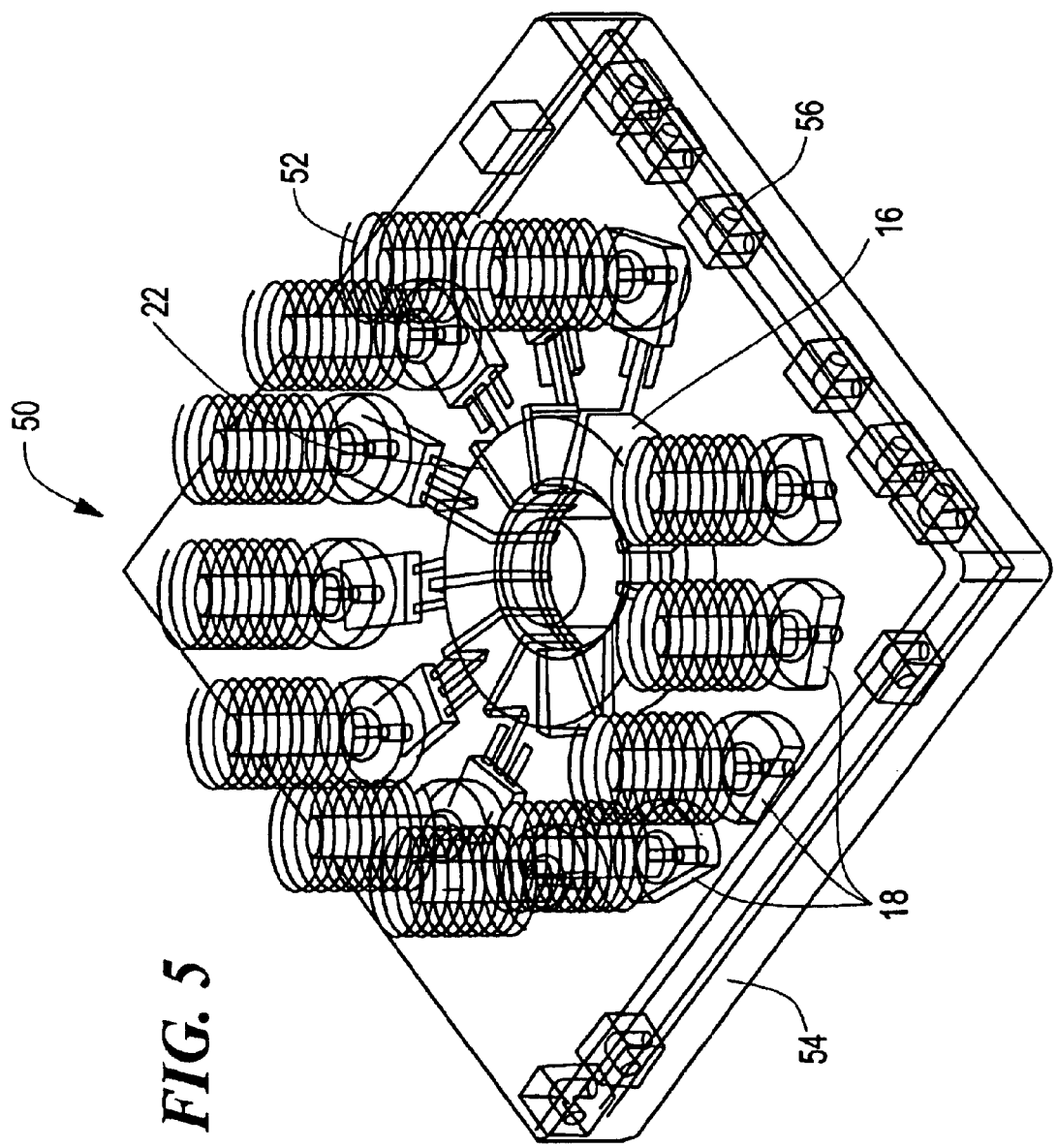
FIG. 5 is a three dimensional diagram of one embodiment of the switch modules of the present invention.

FIG. 5 is a three dimensional diagram representing of one embodiment of a switch module of the present invention. The switch module 50 includes a transformer 16 formed of a ferrite toroid core. As described above, using a toroid core is advantageous because the length and conformation of wire forming each secondary winding 22 can be substantially the same. This enables each switch 18 to turn off and on at substantially the same time. Switches 18 are positioned around the toriod core 16 and are connected to the secondary windings 22 as described above.

The switch module 50 can be surrounded by an epoxy casting 54, as illustrated in FIG. 5. Power and load terminals 56 may be positioned at the edges of the epoxy casting 54. The switch module 50 of FIG. 5 is particularly suitable for stacking multiple switch modules as described below in connection with FIG. 6. Heat exchangers 52 serve to remove from the modulators heat generated in the switches 18.

Figure 6:
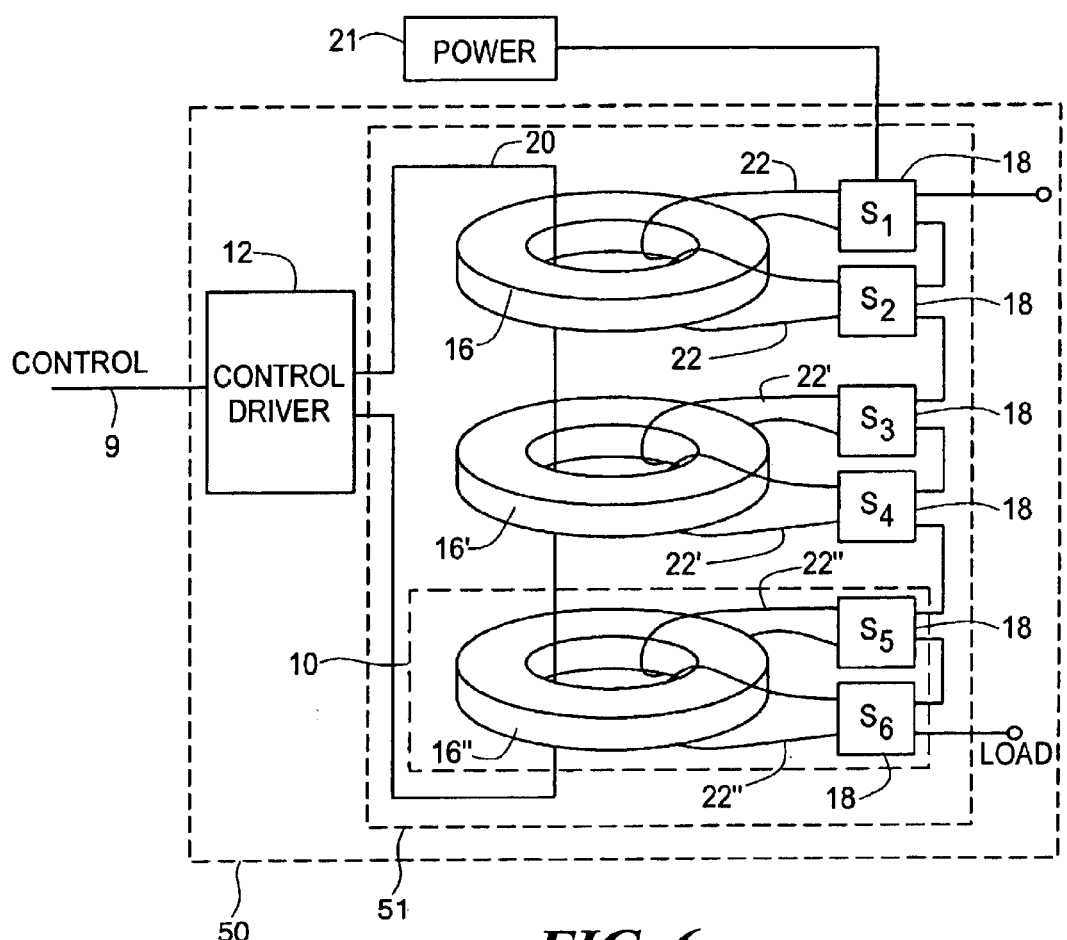
FIG. 6 is a simplified schematic of a modulator that includes stacked switch modules in accordance with the invention.

FIG. 6 is a simplified schematic of a modulator 10 that includes stacked switch modules 51 that share the same primary winding 20 in accordance with the invention. Each switch 18 may include input voltage limiting means and output voltage limiting means (both not shown). The ability to stack switch modules and use the same primary winding to substantially simultaneously switch all switches in each of the modulators is particularly advantageous. By stacking switch modules, one skilled in the art can scale the modulator power level to any desired levels of power and voltage and avoid limitations of the prior art.

Thus, in the configurations described above, the present invention provides a very fast high-voltage switch. There are several advantages of modulators of the present invention. For example, the modulators of the present invention can replace protective 'crowbars' in vacuum tube applications because the modulators can typically open and close in less than 0.5 $\mu$S. If either instantaneous or average current through the switch rises above pre-set limits, the modulator simply opens, removing power from the load. The delay from sensing of an over-current condition, such as an arc, to the opening of the switch, can be kept well below 1 $\mu$S. Another advantage is that the 'opening' of the series solid state switch does not shut down power supply operation, as with most conventional crowbars. Furthermore, the modulators of the present invention may also be used as alternatives to conventional circuit breakers in power distribution systems. Because these switches are both opening and closing switches, power can be substantially and "instantly" removed from the load when the switch is commanded to its off state.

When the modulator of the present invention is used as a pulse modulator, the opening and closing of the modulator is controlled by a command signal at low voltage that is applied to the primary of the transformer. The result is a stream of high power pulses into the load, each with rapid (sub-microsecond) rise and fall times, and extremely consistent pulse-to-pulse characteristics.

As described previously, consistent pulse-to-pulse characteristics and fast rise times are very desirable for many applications. Thus, because the switch design and construction can be identical in both a pulsed application and as a series switch, the modulator of the present invention can be used simultaneously as a pulse modulator and as a fast fault protection disconnect system. This can significantly simplify the overall design of systems that incorporate such modulators. Because solid state modulators do not use resonant circuits, each pulse can be arbitrarily sized. This allows complete pulse width and separation flexibility from 30 nS to DC.

Figure 7:
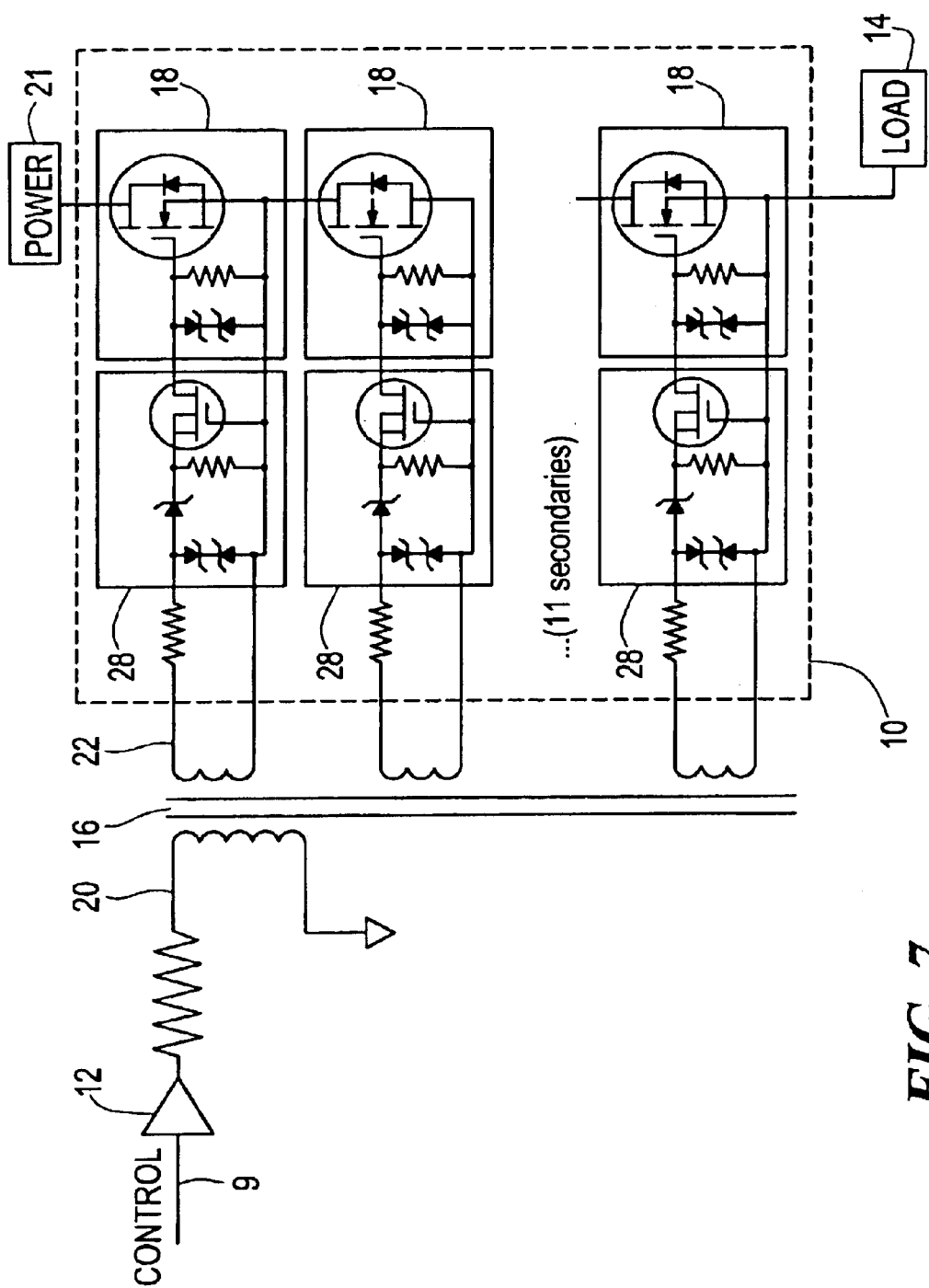
FIG. 7 is a simplified schematic of a retriggerable modulator, in accordance with an embodiment of the invention.

Accordingly, in another aspect, the invention features a modulator capable of switching power to meet rigorous pulse width agility requirements. In this aspect of the invention, the modulator is retriggerable. FIG. 7 is a simplified schematic of a retriggerable modulator 10, in accordance with an embodiment of the invention. This modulator includes a transformer 16, a plurality of retriggerable drive circuits 28, and a plurality of switches 18.

The transformer 16 is configured as described previously in connection with FIGS. 1 through 4. Each retriggerable drive circuit 28 is electrically connected with a respective one of the plurality of secondary windings. Each switch 18 has input and output-high and output-low terminals and a control terminal pair and is associated with a respective retriggerable drive circuit 18. The control terminal pair of each switch 18 is electrically connected with the output pair of the respective retriggerable drive circuit 28.

During operation, when a first control signal is applied to the primary of transformer 16 via the input 9, a voltage is induced in each secondary of the transformer 16. Then, each of the plurality of switches 18 is substantially simultaneously switched by the first signal applied to the primary and remains substantially on until a second signal is applied to the primary of the transformer 16. During this time, each switch 18 can switch the power from power supply 21.

Ideally, once a switch 18 is switched on, it is not necessary to hold it in the "on" position once switching is complete. Because the input of the switch looks like a capacitor to the secondary of the transformer 18, large drive currents are only necessary to charge this capacitance quickly, but no drive current is necessary to sustain it. Thus, in theory, the primary pulse can be turned off, and the switch 18 will remain on (if the gate is isolated by a diode) until a negative pulse is provided. In practice, however, the transformer flux will reset, pulling the gate on the control input of the switch 18 negative by a small amount and shutting down the switch 18. In addition, the gate capacitance of the switch 18 is accompanied by a finite leakage, which will eventually increase the "on" state conduction losses and finally shut down the pulse. Both of these problems can be overcome by using the retriggerable drive circuit 28 of FIGS. 7 and 8.

In operation, a gate pulse, such as a positive going pulse, passes transparently through the series FET and Zener diode of each of the retriggerable drive circuits 28, so each of the switches 18 will be switched on substantially simultaneously. When the gate pulse ends or the core of transformer 16 saturates however, the core reset voltage is insufficient to conduct through the series Zener (which has a blocking voltage of about 5V) of the retriggerable drive circuit 28. Therefore, the series FET of the retriggerable drive circuit 28 blocks the reverse bias during reset. In this manner, each switch 18 remains on either until a negative-going "end of pulse" trigger is sent through the primary, or until the gate charge leaks away. The gate leakage can be mitigated by simply retriggering a short on pulse to keep the switch on indefinitely.

Figure 8:
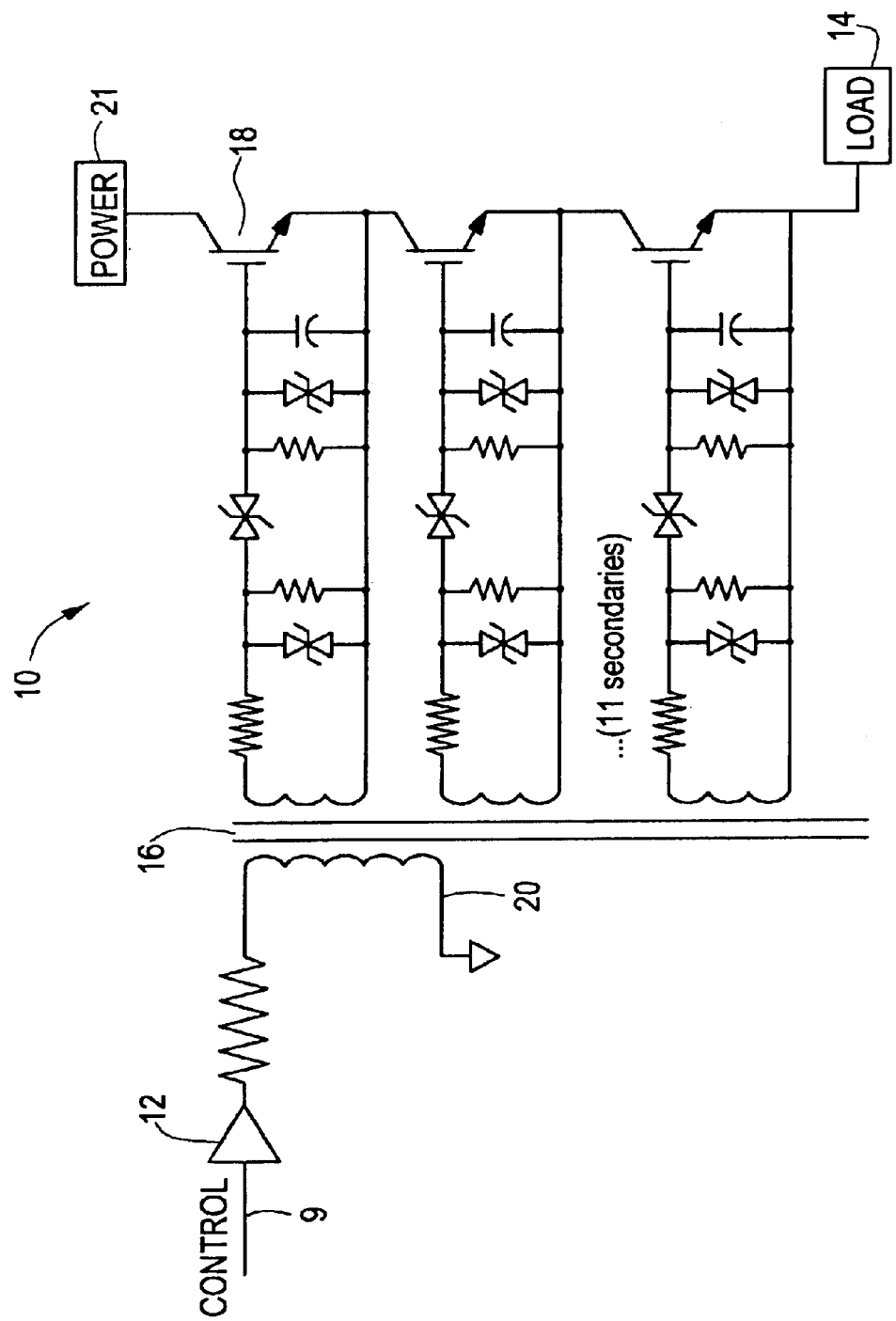
FIG. 8 is a simplified schematic of another implementation of a retriggerable modulator, in accordance with an embodiment of the invention.

FIG. 8 illustrates an alternate embodiment of the retriggerable switch. The retriggerable switch of FIG. 8 includes a bipolar voltage limiting means electrically connected in series with a gate circuit, such as back-to-back Zener diodes. In this circuit, the series FET is not required, and the gate is kept at negative voltage in the off-state for better noise immunity. This circuit requires a larger drive voltage, which also improves noise immunity.

In another embodiment, a refresh control circuit (not shown) can be used to generate "retrigger" pulses at specified intervals, thus recharging the control input of each switch 18 and extending the high voltage on-states and off-states pulse as long as desired.

While the preferred embodiments have been shown and described, it should be understood that there is no intent to limit the invention by such disclosure, but, rather, is intended to cover all modifications and alternate constructions falling within the spirit and scope of this invention

What is claimed is:

1. A modulator comprising:
   a transformer comprising a primary winding and a plurality of secondary windings;
   a control driver for producing electrical control signals, said control driver being in electrical communication with said primary winding and being in electrical communication with a source of electrical power; and
   a plurality of switches, each switch having an input terminal pair and at least one output terminal pair, said input terminal pair being in electrical communication with a respective said transformer secondary winding, and each switch having an input voltage limiting device in parallel with said input terminal pair, said input voltage limiting device providing a common defined voltage to each said switch;
   wherein the plurality of switches are substantially simultaneously switched on by a time varying electrical control on-pulse and maintained in an on state for a predetermined extended length of time by a plurality of time varying electrical control on-pulses produced by said control driver, said on-pulse being substantially of a first polarity, and wherein the plurality of switches are substantially simultaneously switched off by a time varying electrical control off-pulse and maintained in an off state for a predetermined extended length of time by a plurality of time varying electrical control off-pulses produced by said control driver circuit, said off-pulse being substantially of a second polarity, said second polarity being opposite to said first polarity.

2. The modulator of claim 1 wherein the transformer further comprises a magnetic core having a relative magnetic permeability exceeding a magnitude of one.

3. The modulator of claim 1 wherein the input voltage limiting device is comprised of devices selected from the group consisting of Zener devices and varistor devices.

4. The modulator of claim 1 wherein at least one of the plurality of switches is comprised of devices selected from the group consisting of insulated gate bipolar transistors, avalanche-rated field effect transistors, and high voltage metal oxide field effect transistors.

5. The modulator of claim 1 wherein the outputs of a plurality of switches are substantially connected in series.

6. The modulator of claim 1 wherein the outputs of a plurality of switches are substantially connected in parallel.

7. The modulator of claim 1 wherein the outputs of a plurality of switches are connected in series/parallel combination.

8. The modulator of claim 1 wherein the on-pulse further comprises a succession of similar time varying electrical control pulses of said first polarity.

9. The modulator of claim 1 wherein the off-pulse further comprises a succession of similar time varying electrical control pulses of said second polarity.

10. The modulator of claim 1, further including an output voltage limiting device bridging said output terminal pair, wherein said output voltage limiting device is comprised of devices selected from the group consisting of Zener devices and varistor devices.

11. The modulator of claim 1, further including a series combination of a resistor and at least one Zener device in the electrically conductive path between said secondary winding and the input voltage limiting device.

12. The modulator of claim 1, wherein the primary winding comprises a distributed primary winding.

13. A modulator comprising:
   a plurality of transformers comprising substantially a primary winding and a plurality of secondary windings;
   a plurality of retriggerable drive circuits each having a buffer input terminal pair and a buffer output terminal pair, the buffer input terminal pair of each of the retriggerable drive circuits being in electrical communication with a respective member of the plurality of secondary windings and having at least one input voltage limiting device in parallel with the buffer input terminal pair, said input voltage limiting device providing a common defined voltage to each said retriggerable drive circuit;
   a plurality of switches, each switch associated with a respective retriggerable driver circuit and having an output terminal pair and an input terminal pair, the input terminal pair of each switch being in electrical communication with a respective buffer output terminal pair of the retriggerable drive circuit; and
   wherein each of the plurality of switches is substantially simultaneously switched on by at least one first electrical signal applied to the primary and remains substantially on for a predetermined extended length of time by a first plurality of electrical signals applied to the primary until at least one second electrical signal is applied to the primary and is maintained in substantially in an off state for a predetermined extended length of time by a second plurality of electrical signals applied to the primary.

14. The modulator of claim 13 wherein the transformer further comprises a magnetic core having a relative magnetic permeability exceeding a magnitude of one.

15. The modulator of claim 13 wherein the voltage limiting device is comprised of devices selected from the group consisting of Zener devices and varistor devices.

16. The modulator of claim 13 wherein at least one of the plurality of switches is comprised of devices selected from the group consisting of insulated gate bipolar transistors and avalanche-rated field effect transistors.

17. The modulator of claim 13 wherein the outputs of a plurality of switches are substantially connected in series.

18. The modulator of claim 13 wherein the outputs of a plurality of switches are substantially connected in parallel.

19. The modulator of claim 13 wherein the outputs of a plurality of switches are connected in series/parallel combination.

20. The modulator of claim 13 wherein at least one of the plurality of retriggerable drive circuits comprises a Zener device connected in series with a field effect transistor.

21. The modulator of claim 13 wherein at least one of the plurality of retriggerable drive circuits comprises a bipolar voltage limiting device, wherein said bipolar voltage limiting device is comprised of devices selected from the group consisting of Zener devices and varistor devices.

22. The modulator of claim 13 wherein said first signal and said second signal are substantially different.

23. The modulator of claim 13, further including an output voltage limiting device in parallel with said output terminal pair of at least one switch, wherein said output voltage limiting device is comprised of devices selected from the group consisting of Zener devices and varistor devices.

24. The modulator of claim 13 wherein the modulator comprises a stack of modulators sharing the primary of the transformer.

25. The modulator of claim 13 wherein each secondary winding of the transformer controls a respective plurality of switches.

26. A modulator comprising:

a plurality of stacked transformers sharing the same primary, wherein the primary comprises at least one winding and each transformer further comprises a plurality of secondary windings; and a plurality of switches, each switch associated with a respective secondary winging and having input and output terminal pairs, the input terminal pair of each switch being in electrical communication with a respective secondary winding and having at least one voltage limiter in parallel with said input terminal pair, said voltage limiter providing common defined voltage to each said switch, wherein the plurality of switches are substantially simultaneously switched on by a first input signal applied to the primary and maintained in an on state for a predetermined extended length of time by a first plurality of input signals applied to the primary and switched off by a second input signal and maintained in an off state for a predetermined extended length of time by a second plurality of input signals applied to the primary.

* * * * *